United States Patent [19]

Dodds et al.

[11] 4,123,709
[45] Oct. 31, 1978

[54] ADAPTIVE DIGITAL DELTA MODULATION FOR VOICE TRANSMISSION

[75] Inventors: David E. Dodds; Andrzej M. Sendyk, both of Saskatoon; Donald B. Wohlberg, Richmond, all of Canada

[73] Assignee: Canadian Patents and Development Limited, Ottawa, Canada

[21] Appl. No.: 762,436

[22] Filed: Jan. 24, 1977

[51] Int. Cl.² ............................................. H03K 13/22
[52] U.S. Cl. ................................ 325/38 B; 332/11 D
[58] Field of Search ................ 325/38 B; 332/11 D; 179/15 AV

[56] References Cited

U.S. PATENT DOCUMENTS

| 3,273,141 | 9/1966 | Hackett | 325/38 B |
|---|---|---|---|
| 3,500,441 | 3/1970 | Brolin | 325/38 B |
| 3,609,551 | 9/1971 | Brown | 325/38 B |
| 3,621,396 | 11/1971 | Daugherty | 325/38 B |
| 3,699,566 | 10/1972 | Schindler | 332/11 D |
| 3,716,803 | 2/1973 | Candy | 325/38 B |
| 3,757,252 | 9/1973 | Deschenes | 325/38 B |
| 3,784,922 | 1/1974 | Blahut | 325/38 B |
| 3,806,806 | 4/1974 | Brolin | 332/11 D |
| 3,905,028 | 9/1975 | Wintz et al. | 179/15 AV |
| 3,913,016 | 10/1975 | Candy | 325/38 B |
| 4,044,306 | 8/1977 | Villeret | 325/38 B |

Primary Examiner—Robert L. Griffin
Assistant Examiner—Michael A. Masinick
Attorney, Agent, or Firm—Edward Rymek

[57] ABSTRACT

An adaptive delta modulation system wherein the input analog signal is periodically sampled and a binary bit is generated for each period, the logic level of the binary bit being dependent on whether the sampled signal is greater or smaller than the approximate signal of the previous sample. Decoding apparatus converts the stream of binary bits to approximate the analog signal by periodically charging or discharging a capacitor integrator by predetermined variable steps. The charging or discharging of the integrator during each period is determined by the logic level of the binary bits, whereas the increase or decrease in step size for successive periods is determined by successive similar signal binary bits or successive dissimilar bits, respectively. The increase or decrease in step size is achieved by storing a binary step size number S in a register and adding or subtracting a fraction of the number to or from itself during each period, producing a new step size number for each period. In addition, each added fraction may be increased by a fixed least significant number to enhance step size recovery between a transmitter and a receiver. The charge on the capacitor integrator is controlled by a pulse having a width that is directly related to the value of the S number. The pulse controls the conduction time of constant current sources which are connected to the integrator to produce the analog output signal.

8 Claims, 5 Drawing Figures

ADAPTIVE DIGITAL DELTA MODULATION FOR VOICE TRANSMISSION

BACKGROUND OF THE INVENTION

This invention is directed to digital delta modulation for voice transmission and in particular to apparatus in which the step size for the delta modulation varies approximately exponentially.

In recent years, delta modulation systems have found widespread use in voice communication since such systems enable digital transmission of analog signals with relative simplicity and efficiency. In the early systems, the reconstructed output analog signal amplitude changed by a fixed step from the amplitude of a preceeding sample. However, since the sampling times and the step size were fixed, it was found that distortions occurred when the analog signal had very large or very small slopes.

To remedy this problem, variable step size modulators were developed wherein the step sizes for successive samples of the analog signal could be increased or decreased under predetermined conditions. This development has improved the performance of the delta system, however some distortion in voice communication remains particularly when channel errors occur between the transmitter and receiver.

SUMMARY OF THE INVENTION

It is therefore an object of this invention to provide a simple delta modulator system in which the step size varies in substantially an exponential manner.

It is another object of this invention to provide a delta modulator system which conveys the step size numbers even in the presence of channel error between the transmitter (local) and receiver (remote) decoders.

These and other objects are achieved in an adaptive delta modulation system wherein an analog signal is represented by a stream of signal binary bits each occupying a fixed time period. The stream of signal binary bits are produced by an encoder which periodically samples the input analog signal and generates a binary bit for each period, the logic level of the binary bit being dependent on whether the sampled analog signal is greater or smaller than the approximate analog signal of the previous sample generated by the local decoder. To convert the stream of signal binary bits to the approximate signal, in either the transmitter or receiver, a decoder is provided which includes an integrator, such as a capacitor integrator that is periodically charged or discharged by steps which vary approximately exponentially so as to follow as closely as possible the value of the original analog signal. In the encoder, this signal is compared to the original analog signal to generate the stream of binary bits.

In accordance with the present invention, the signal on the integrator is increased or decreased by a variable step size in response to each bit, with the increase or decrease in each period being determined by the logic level of the binary bit. In addition, the step size varies approximately exponentially for successive periods with the step size increasing in response to a number of successive similar signal binary bits and decreasing in response to a number of successive dissimilar bits. The number of successive similar or dissimilar bits may be two. The increase or decrease in step size is achieved by storing a binary step size number S in a shift register and adding or subtracting a fraction ΔS to or from it during the particular period, by means of a serial adder, this produces a new step size number S for each period. Further, each added fraction ΔS may be increased by a fixed least significant number to enhance step size recovery between the local and the remote decoder.

The charging and discharging of the capacitor integrator may be accomplished by converting the binary S number to a control pulse that has a width which is directly related to the value of the S number. The width of this control pulse controls the conduction time of constant current sources which are connected to the integrating circuit to increase the charge on the capacitor during a particular period when the signal binary bit is at one logic level, and to decrease the charge on the capacitor during a particular period when the signal binary bit is at the other logic level.

DESCRIPTION OF THE PREFERRED EMBODIMENT

Figure 1:
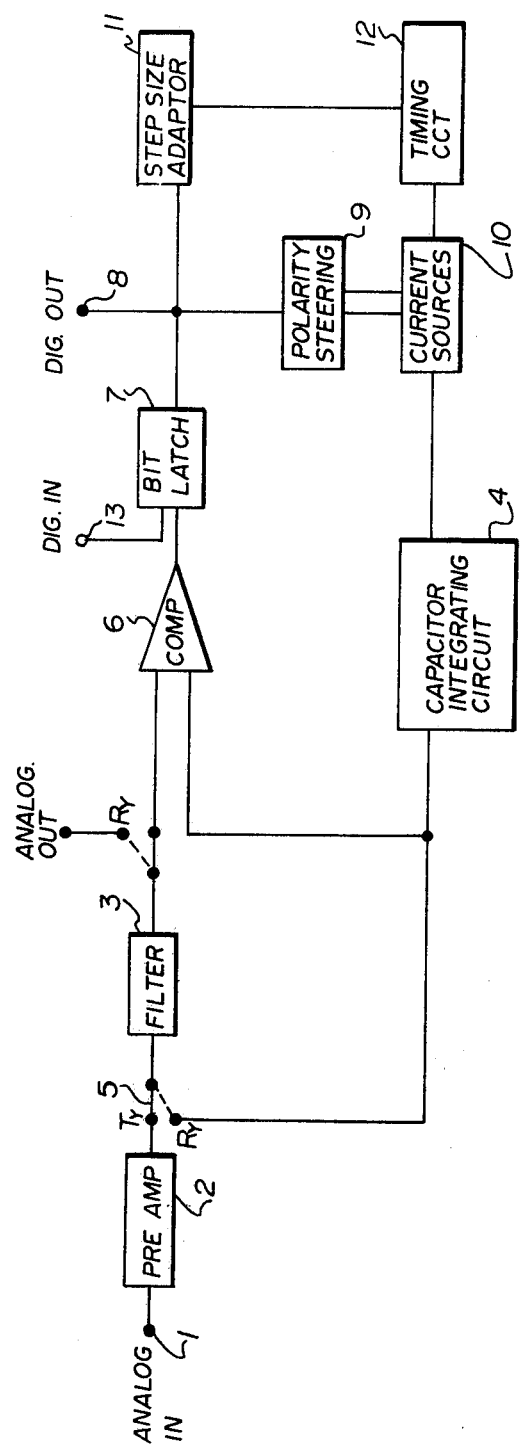
FIG. 1 is a block diagram of an adaptive delta modulator system in accordance with the present invention.

The block diagram in FIG. 1 illustrates a push to talk (PTT) delta modulation voice transceiver that is set in the transmit mode. The use of PTT in voice communication systems is generally accepted as a practical means of avoiding the duplication of components in a transceiver. However, although the systems in accordance with the present invention is embodied as a PTT transceiver, in the description with respect to FIG. 1, it may also be embodied in separate transmitter-receiver systems. In addition, a transmitter or a transceiver in the transmit mode would include an encoder with its local decoder shown in FIG. 1 and a modulator, which is not shown, for modulating the digital output signal for transmission to a remote receiver. The remote receiver or the transceiver in the receive mode would include a remote decoder which is identical to the local decoder and a demodulator, which is not shown, for demodulating the received signal to provide the digital input signal.

The analog voice signal to be transmitted is coupled to terminal 1, of the encoder, amplified by a preamplifier 2 and passed through a filter 3 via switch 5. The filtered analog signal is connected through a switch 5′, and with a signal on a capacitor integrator 4, are coupled into a comparator 6. Comparator 6 produces a high or low logic level (1,0) output depending on whether the amplitude of the analog voice signal is greater or smaller respectively than the signal on the integrator 4, of the local decoder. The comparator 6 is coupled to a bit latch 7 which periodically samples the comparator 6 output at a predetermined clock rate SAMP and thus provides a digital output signal consisting of a series of binary bits at output terminal 8 for modulation and transmission to a remote receiver. In addition, this digital output is used in the decoder to drive a constant current source polarity steering circuit 9 and an adaptor 11.

Adaptor 11 computes a digitized value S on the basis of the short and long time history of the digital output signal, the value of the S number being a digital representation of step size. The S number is computed for each successive signal binary bit and is made to increase or decrease approximately exponentially depending on whether the output from the bit latch 7 consists of successive similar bits or dissimilar bits respectively.

The S number from the adapator 11 is periodically directed to the timing circuit 12 and converted into a time interval representative of the S number. The timing circuit 12 drives a constant current source 10 to transfer a charge which is representative of the S number onto the capacitor integrator 4, the polarity of the charge being dependent on the signal from the steering circuit 9 and thus the logical level of the digital bit from the bit latch 7. Finally according to the usual delta coding principle, positive and negative steps are integrated by the integrator 4 and a quantized analog signal is reconstructed and supplied to the comparator 6. Due to the feedback principle in the encoder, the reconstructed signal is a close approximation of the original voice signal.

In the remote receiver in the receive mode, switches 5 and 5' are set in their second position. A series of binary bits from the transmitter is received, demodulated and connected to the bit latch 7 of the remote decoder through terminal 13. This signal is processed through the polarity steering circuit 9, adaptor 11, timing circuit 12, current source 10 and integrator 4 as described above to provide an analog signal at the output of the integrator 4, which is a copy of the input signal to the transmitter. In order to reduce the noise caused by quantization, the signal reconstructed at the integrator 4 is passed through the bandpass filter 3 via switch 5 to bandlimit the voice signal. The voice signal is then taken out of the transceiver through terminal 14 via switch 5'.

The preamplifier 2, filter 3, and comparator 6 may be conventional circuits and therefore need not be described in detail.

Figure 2:
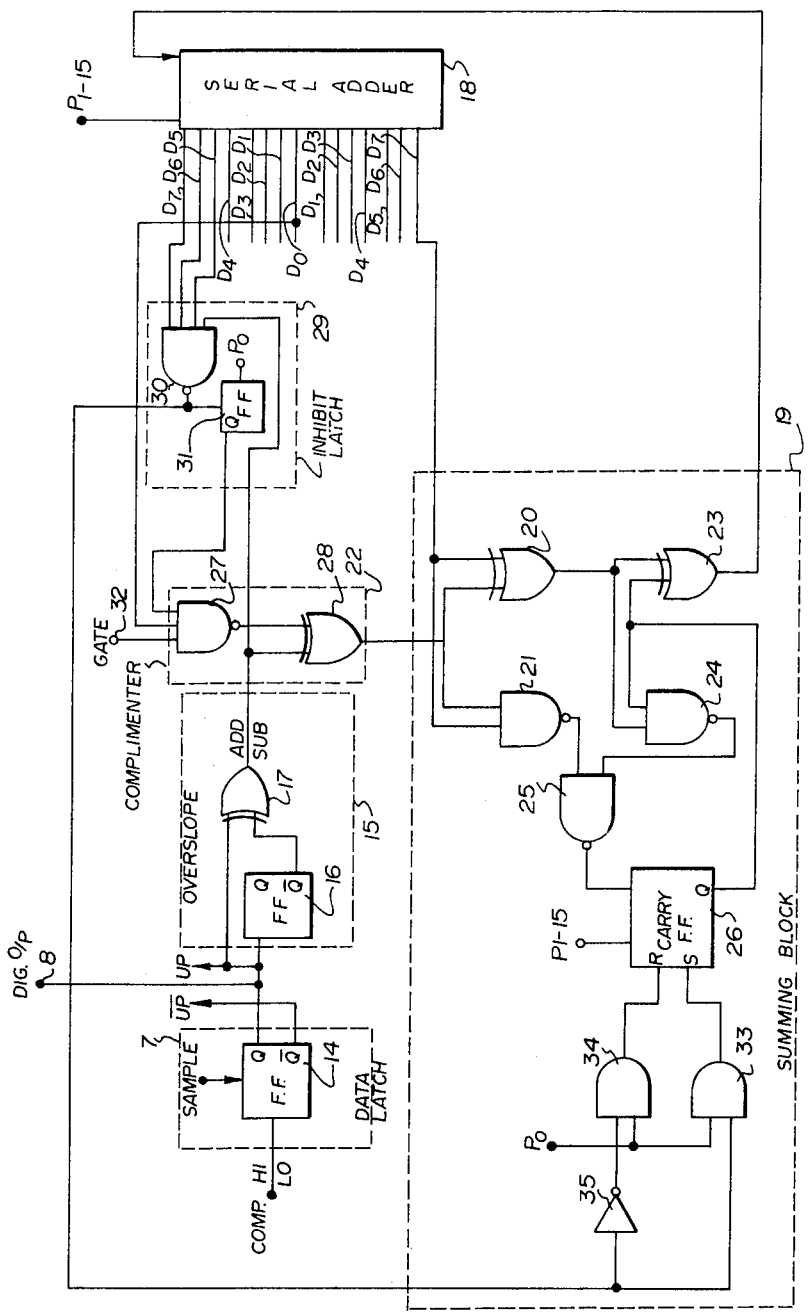
FIG. 2 illustrates the adaptor in detail.
Figure 3:
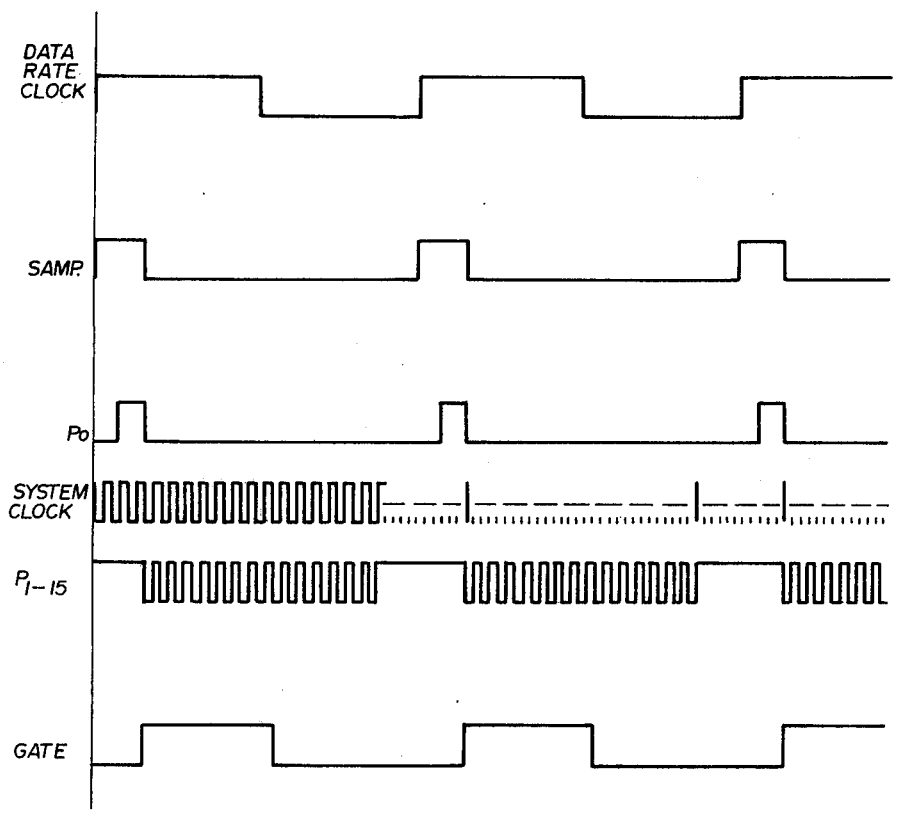
FIG. 3 illustrates the clocking pulses for the system.

Adaptor 11 which is shown in greater detail in FIG. 2 operates under the control of the clocking pulses shown in FIG. 3. The clocking circuitry is controlled by a "DATA RATE CLOCK" (DRC) which is normally supplied along with the data signal from a data transmission modem and which may be in the order of 10-50 KHz. The timing circuitry generates a SAMP pulse, a control pulse $P_0$, a system clock, a pulse series $P_{1-15}$ and a GATE pulse. The SAMP pulse is generated for each cycle of the DRC so as to occur just after the positive going edge of the DRC. The SAMP pulse is used to sample and shift the data from comparator 6 (FIG. 1) once per DRC cycle through the data latch 7 (FIGS. 1 and 2).

Control pulse $P_0$ is generated during the last half of the SAMP pulse. Its use will be described below with respect to FIG. 2.

Pulse series $P_{1-15}$, which need not be in synchronism with the DRC consists of a series of 15 pulses to directly follow control pulse $P_0$, and is generated from the SYSTEM CLOCK which has a frequency at least 17 times higher than the DRC.

Finally, a GATE pulse is generated by the clocking circuitry, so as to be high during a predetermined number of initial pulses in the pulse series $P_{1-15}$. Its use will also be described below.

Further with respect to FIG. 2, data latch 7 which may be a D flip-flop 14, samples the output of the analog comparator 6 (FIG. 1) on the leading edge of the SAMP pulse and holds the logic level for transmission at output terminal 8 for one period of the DRC. Outputs up and $\overline{up}$ from the flip-flop are also used to steer the current sources 10 (FIGS. 1 and 4) in order to charge or discharge an integrator thereby reconstructing the voltage signal.

The output Q from flip-flop 14 in data latch 7 is fed to an overslope detector 15 which consists of a flip-flop 16 and an exclusive OR gate 17. With the input to the exclusive OR gate 17 connected to the Q terminal of flip-flop 14 and the $\overline{Q}$ terminal of flip-flop 16, the exclusive OR gate 17 provides a logic level 1 at its output when the present and previous signal binary bits are the same to indicate the requirement for a step size increase and gate 17 provides a logic level 0 at its output when the present and previous signal binary bits are different to indicate the requirement for a step size decrease.

It has been determined that in order to follow a voice analog signal without undue degradation, an adaptive system which varies the step size in an exponential manner is ideally preferred to provide a rapid attack time when large changes occur in the signal amplitude.

In the present embodiment, the multiplication and division required in exponential adaption is approximated by adding and subtracting a small fraction of S to itself, i.e. $S_{(n)} = S_{(n-1)}(1 + \Delta)$ for an increase and $$S_n = S_{(n-1)}(1 - \Delta) \approx \frac{S_{(n-1)}}{1 + \Delta}$$

for a decrease. To achieve this the adaptor in FIG. 2 includes a shift register 18 which contains a digital representation of the step size number S, and a summing block 19 which adds or subtracts a fraction of the S number to itself. Shift register 18 consists of a 15 position serial shift register with outputs $D_0$ to $D_7$ above the binary point and outputs $D_{-1}$ to $D_7$ below the binary point. A parallel register or a serial register with different length could be adapted with ancillary circuits to perform the same function.

The summing circuit 19 includes a first exclusive OR gate 20 and a first NAND gate 21. One of the inputs of each of the gates 20 and 21 are connected to output $D_{-7}$ of shift register 18 while the second input of each of the gates 20 and 21 are connected to output $D_0$ through a complementer 22. The output of gate 20 is connected to one input of a second exclusive OR circuit 23 and of a second NAND gate 24. The output from exclusive OR gate 23 is coupled to the shift register 18 input. Further, the summing circuit 19 includes a third NAND gate 25 with inputs coupled to gates 21 and 24 in order to control the carry flip-flop 26 which is clocked by pulse series $P_{1-15}$ as is shift register 18. The output of flip-flop 26 is connected to the second inputs of gates 23 and 24. In this way, as the S number is shifted through the shift register 18, the S number is added to a fraction of itself by sequentially adding the bit at position $D_0$ to the bit at position $D_{-7}$ and entering the added bit into the register 18. For this particular operation, a 3 input NAND gate 27 in complementer 22 serves to add "zeros" to the most significant end of the S number in a manner to be described later. The following arithmetic operation is thus achieved.

$$S_{(n)} = S_{(n-1)} + \frac{S^T_{(n-1)}}{128}$$

when $S^T_{(n-1)} = S_{(n-1)}$ truncated at the binary point. If the summing circuit is connected to outputs $D_{-7}$ and $D_{-1}$, the arithmetic operation $$S_{(n)} = S_{(n-1)} + \frac{S^T_{(n-1)}}{64}$$

would be achieved where $S^T_{(n-1)} = S_{(n-1)}$ truncated starting with $D_{-2}$ which would require a variation of the GATE pulse shown in FIG. 3.

In accordance with well known rules of binary arithmetic, subtraction is attained by complementing the bit stream representing the fraction of S that enters the summing circuit 19 and then adding one lowest significant bit to the resultant of the addition of S and the complemented fraction. Complementing is achieved in the complementer 22 which is coupled between overslope detector 15 and summing circuit 19. Complementer 22 includes the NAND gate 27 with one input coupled to shift register 18 output $D_0$, a second input coupled to an inhibit latch 29 and a third input coupled to the gate pulse on terminal 32, and an exclusive OR gate 28 with one input coupled to gate 27 and a second input coupled to the output of overslope detector 15. When overslope detector 15 provides a high logic level output for the add mode, inhibit latch 29 provides a high logic level output to allow the desired fraction to pass and the gate pulse is high; a "1" at output $D_0$ will produce a "1" at the output of complementer 22, and a "0" at output $D_0$ will produce a "0" at the output of complementer 22. However, if the output of overslope detector 15 is changed to a low logic level for the subtract mode, a "1" at output $D_0$ will produce a "0" at the output of complementer 22, and a "0" at output $D_0$ will produce a "1" at the output of complementer 22, thus complementing the number.

The addition of the lowest significant bit to the resultant of the addition of the complemented fraction and the number S is achieved in the summing circuit 19 by the carry flip-flop 26 which is preset at the start of each cycle by NAND gate 33 which has one input coupled to the clock pulse $P_0$ and the second input coupled to the inhibit latch 29.

Inhibit latch 29 includes a NAND gate 30 having four inputs, the first three of which are connected to outputs $D_7$, $D_6$ and $D_5$ respectively and the fourth is connected to the output of overslope detector 15. Thus the NAND gate 30 provides a "1" output at all times except when the overslope detector 15 provides an "add" signal and the serial adder has a "1" in the three most significant locations indicating an impending overflow condition. NAND gate 30 is coupled to AND 33 to reset flip-flop 26 at the beginning of each add or subtract cycle during normal conditions and is further coupled to a second AND gate 34 through an inverter 35 to assure that flip-flop 26 is not reset at the beginning of an add cycle for which overflow conditions exist. NAND gate 30 is further coupled to a flip-flop 31, and operates to reset flip-flop 31 at the beginning of each add cycle under normal conditions as clocked by pulse $P_0$. Further flip-flop 31 is coupled to one input of NAND gate 27. Thus when an overflow condition is detected, inhibit latch 29 operates to make the fraction of S number which is to be added to the S number, equal to zero.

On the other hand, the S number cannot be decreased below a predetermined value since with the outputs $D_0$ to $D_7$ at "0", the value of the fraction subtracted from the S number will be zero.

As described with respect to the carry flip-flop 26, flip-flop 26 is preset to add a least significant bit to the S number for each cycle, except for the overflow condition. This feature performs an important function with respect to low region start up and step size recovery. In normal operation, the step size is confined between an upper and lower numerical limit. During squelch or some power turn-on conditions, the step size will contain all zero bits above the binary point. This means that the fraction of the S number $S/2^n$ input to the summing circuit 19 will always be zero and the value of step size could never increase. When the carry flip-flop is always preset, this ensures that at least 1/128 is added to the S number. The add/subtract equations become:

ADD $$S_{(n)} = S_{(n-1)} + \frac{S^T_{(n-1)} + 1}{128}$$

SUBT $$S_{(n)} = S_{(n-1)} - \frac{S^T_{(n-1)}}{128}$$

where $S^T_{(n-1)}$ is the truncated value.

Figure 4:
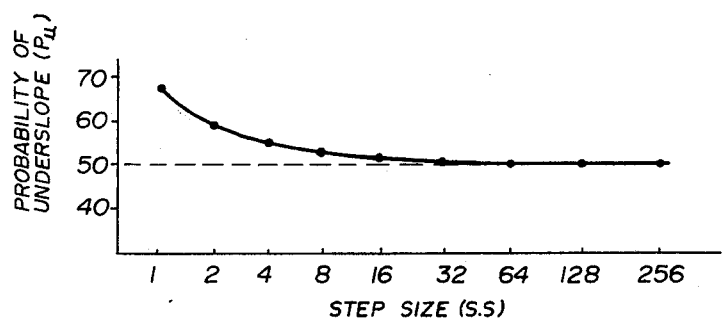
FIG. 4 is a graph of underslope probability versus step size.

Step size inequality will occur between the local decoder in the transmitter encoder and the remote decoder in the receiver when the two units are started at different times or when there are digital channel errors. Since the adaptor in the local and remote decoders both increase the value of S by a value equal to the least significant bit during each ADD cycle, the step size is larger than than ideal and the result is a slight increase in the average number of underslopes. This makes the value in the remote decoder approach the value in the local decoder since the step size adaption is non-linear. At large values of S many additional ones must be added to the least significant bit (LSB) before an additional underslope or reduction will occur to reduce the average value of S. At small values of S the additional one to the LSB makes a more significant increase in S and therefore additional underslopes must occur more frequently. A graph of underslope probability versus step size is shown in FIG. 4. When the receiver has a step size which is too large, for example, when a larger number will be subtracted from its S number than from the transmitter S number when the additional underslopes occur. The difference is thus reduced by an amount proportional to the difference for each additional underslope.

In the absence of transmission errors the magnitude of the difference will decrease with time. The equations that follow express the expected or average change in this difference for each clock cycle and thus a decay time constant for the difference may be expressed in terms of the data clock period. These equations neglect the effects of truncation.

It is first necessary to calculate the probability of an increase or decrease in step size for each cycle clock.

$$P_I + P_D = 1$$

$$P_I[\Delta \overline{S}_E + \sigma] + P_D[-\Delta(\overline{S}_E + \Delta \overline{S}_E] = 0$$

substituting we obtain:

$$P_I[\Delta \bar{S}_E + \sigma] + [1 - P_I][-\Delta(\bar{S}_E + \Delta \bar{S}_E)] = 0$$

$$P_I = \frac{\Delta \bar{S}_E + \Delta^2 \bar{S}_E}{2\Delta \bar{S}_E + \Delta^2 \bar{S}_E + \sigma}$$

$$P_D = \frac{\Delta \bar{S}_E + \sigma}{2\Delta \bar{S}_E + \Delta^2 \bar{S}_E + \sigma}$$

where $P_I$ = probability of an increase in step size due to overslope condition,
$P_D$ = probability of a decrease in step size due to underslope condition,
$\bar{S}_E$ = average value of step size prior to an increase,
$1 + \Delta$ = multiplying constant for an increase,
$1 - \Delta$ = multiplying constant for a decrease,
$\sigma$ = fraction added during each increase.

The value of step size at the decoder will be equal to the value in the encoder plus the difference error between the two.

$$\bar{S}_D = \bar{S}_E + E$$

The expected or average change in the error, E{SE} may be expressed as:

$$E\{\delta \epsilon\} = P_I[\Delta(\bar{S} + \bar{\epsilon}) + \sigma] + P_D[-\Delta(\bar{S} + \bar{\epsilon} + \Delta \bar{S} + \Delta \bar{\epsilon})]$$

substituting we obtain:

$$E\{\delta \epsilon\} = \left(\frac{\Delta \bar{S} + \Delta^2 \bar{S}}{2\Delta \bar{S} + \Delta^2 \bar{S} + \sigma}\right)(\Delta \bar{S} + \Delta \epsilon + \sigma) -$$

$$\left(\frac{\Delta \bar{S} + \sigma}{2\Delta \bar{S} + \Delta^2 \bar{S} + \sigma}\right)(\Delta \bar{S} + \Delta \bar{E} + \Delta^2 \bar{S} + \Delta^2 E)$$

$$E\{\delta \epsilon\} = \frac{-\sigma \Delta \bar{E} - \sigma \Delta^2 E}{2\Delta \bar{S} + \Delta^2 \bar{S} + \sigma}$$

neglecting terms in $\Delta^2$ and dividing all terms by $\sigma$ we have:

$$E\{\delta \epsilon\} = \frac{-\Delta \bar{\epsilon}}{\frac{2\Delta S}{\sigma} + 1}$$

For the implementation shown here $\Delta = \sigma = 1/128$ and thus:

$$E\{\delta \epsilon\} = \frac{-\Delta \epsilon}{2S + 1}$$

The decay time constant, $N_{TC}$, for the difference in step size is then:

$$N_{TC} = \frac{\epsilon}{-E\{\delta \epsilon\}} = \frac{2S + 1}{\Delta}$$
$$= 256S + 128 \text{ clock periods.}$$

As can be seen, the "time constant" is a function only of the step size and therefore the step size recovery rate is slower for larger values of step size (or signal amplitude). The time constant at S = 256 and 16kB data rate which is the worst case, is approximately 4 seconds.

The step size recovery algorithm has much more effect at lower signal amplitudes and performance evaluation in the presence of pseudorandom errors has shown more stable decoded amplitude at the lower amplitude levels.

Figure 5:
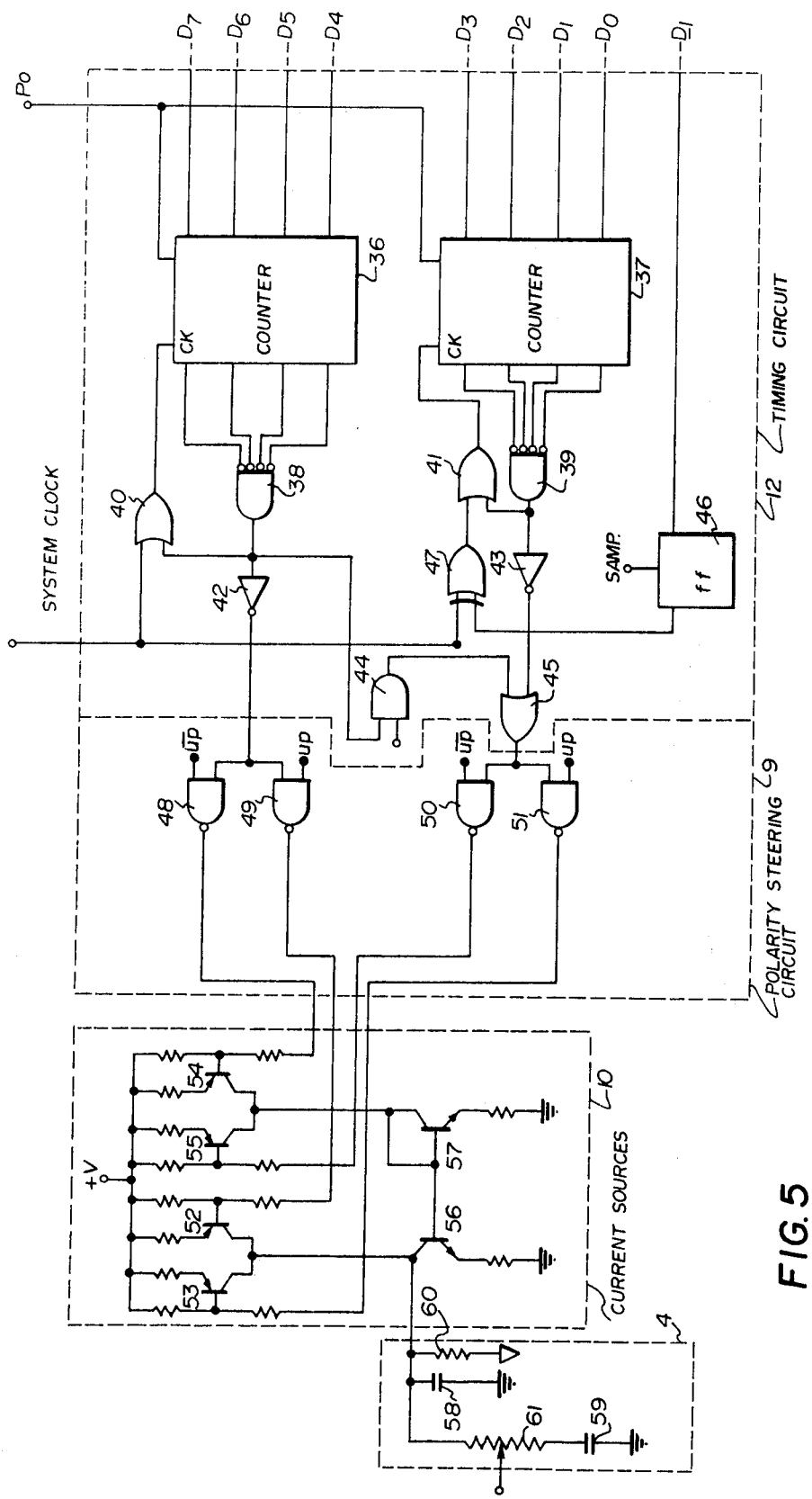
FIG. 5 illustrates the integrator circuit, the current sources and timing circuits in detail.

FIG. 5 illustrates in detail one embodiment of the timing circuits 12, the polarity steering circuits 9, the current sources 10 and the integrator 4 which may be used in conjunction with the system shown in FIG. 1. The timing circuit 12 turns on the constant current source 10 for a discrete time period during each data clock cycle either to charge or discharge the integrator 4 by means of the polarity steering circuit 9. In this embodiment, there are 16 possible time periods which range from 0 to 15. After the charging or discharging period, the current source 10 is turned off and the integrator 4 voltage remains constant until the next cycle.

The timing circuit 12 includes two four place counters 36 and 37. Counter 36 is coupled to outputs $D_7$ to $D_4$ of shift register 18 and counter 37 is coupled to outputs $D_3$ to $D_0$ of shift register 18 such that these may be loaded into the counters at a predetermined time under the control of pulse $P_0$. The four bit positions of each counters 36 and 37 are coupled to respective four input NOR gates 38 and 39 which produce "0" logic level outputs unless the respective counters are at zero. Two OR-gates 40 and 41 which each have one input coupled to the system clock, have their second input coupled to NOR gates 38 and 39 respectively to control the count down of counters 36 and 37 respectively. The outputs from NOR gates 38 and 39 are further coupled through inverters 42 and 43 to steering circuit 9.

The timing circuit 12 further includes an AND gate 44 with inputs coupled to NOR gate 38 and pulse $P_0$, and an OR gate 45 coupled between inverter 43 and the steering circuit 9 with its second input coupled to AND gate 44. This circuit assures a minimum charging or discharging time during each cycle even when the counters 36 and 37 are at zero at the start of the cycle.

In addition, the timing circuit 12 includes a flip-flop 46 which is coupled to the output terminal $D_{-1}$ of shift register 18 and reset by the SAMP pulse. It is used to control an exclusive OR gate 47 which is positioned between the OR gate 41 and the system clock. This circuit inverts the system clock if the shift register 18 content at $D_{-1}$ in a logic "1".

In operation, the pulse $P_0$ which has a positive going edge slightly delayed from the positive going edge of the system clock sets the counters 36 and 37. Counters 36 and 37 are then counted down by the leading edge of the clock. Thus if the number $0001_2$ is preset by $P_0$ the clock gating signal will have a duration slightly less than one period of the system clock. With the circuit for counter 37 modified such that the clock signal is inverted if the shift register content at $D_{-1}$ is logic 1, the negative clock edge applied to the counter 37 is effectively delayed by $\frac{1}{2}$ period, and counter 37 will not begin the count down until $1\frac{1}{2}$ system clock periods after the beginning of $P_0$. This gains an additional bit of resolution in the step size for a total of 9 bits and improves the SNR performance at low signal amplitudes by allowing the step size to adapt to a smaller value.

Thus the timing circuit 12 generates a variable width pulse which occurs at the transmitted data rate on each of two outputs, to control the analog step size.

The polarity of the step change in the integrated signal is controlled by the steering circuit 9 which includes four NAND gates 48, 49, 50 and 51. NAND gates 48 and 49 each have a first input coupled to inverter 42 while NAND gates 50 and 51 each have a first input coupled to OR gate 45. The second inputs of NAND gates 48 and 50 are coupled to the $\overline{UP}$ output from data latch 7 (FIG. 2) and the second inputs of NAND gates 49 and 51 are coupled to the UP output from data latch 7. These NAND gates steer the individual variable width pulses to the current sources 10 so as to charge or discharge the integrator 4.

The current sources 10 include a pair of first transistors circuits 52 and 53 which are biased to generate a constant current when switched on and in which the transistor collectors are commonly connected. Transistor circuit 52 is controlled by NAND gate 49 and produces a current 16 times greater than transistor circuit 53 which is controlled by NAND gate 51. A second pair of transistors circuits 54 and 55 identical to circuits 52 and 53 are controlled by NAND gates 48 and 50 respectively. The commonly connected collectors of circuits 52-53 and 54-55 are connected to ground through transistors 56 and 57 respectively which have a common base connection so as to operate simultaneously. The integrating circuit 4 is connected to the collector of transistor 56. Thus, when the voltage on integrator 4 is to be increased, transistor circuits 52, 53 or both are enabled to deliver charge to the integrator 4. And when the voltage signal is to be decreased, transistor circuits 54, 55 or both are enabled and connected to current mirror transistors 56 and 57 so as to withdraw charge from the integrating circuit 4 through transistor 56.

With the larger current sources 52 and 54 timed with duration 0-15 in discrete unit values and the smaller current sources 53 and 55 timed with duration $\frac{1}{2}$-15$\frac{1}{2}$ in discrete unit values, a discrete amount of charging ranging from $\frac{1}{2}$ to 255$\frac{1}{2}$ units may be delivered or removed from the capacitor in integrator 4.

Integrator circuit 4 may consist of a single integrating capacitor 58, however the second capacitor 59 provides an improved signal-noise ratio. Parallel resistor 60 which is connected to a predetermined fixed voltage, rolls off the integrator characteristic at lower frequencies. The output for the integrated signal is taken at a tap point on resistor 61 which is in series with capacitor 59.

We claim:
1. In an adaptive delta modulation system wherein an analog signal is represented by a stream of signal binary bits each occupying a fixed time period, apparatus for converting the stream of signal binary bits to an analog output signal comprising:
   integrator means for receiving a charge to provide the analog output signal;
   first means for increasing or decreasing the charge on the integrator means by a variable step size S during each of fixed time periods in response to successive signal binary bits, the increase and decrease of the charge being determined by the logic level of the binary bits;
   digital means for storing the step size number S; and
   summing means coupled to the digital storing means for receiving the step size number S and a predetermined fixed fraction $\Delta S$ of the step size number, and for adding or subtracting the predetermined fixed fraction $\Delta S$ of the step size number S to the stored step size number S to produce a resultant step size number for storage in the digital means in response to each successive binary bit, the fixed fraction $\Delta S$ being added to the step size number S in response to successive similar binary bits and the fixed fraction $\Delta S$ being subtracted from the step size number S in response to successive dissimilar bits.

2. Apparatus as claimed in claim 1 wherein said summing means adds the predetermined fraction $\Delta S$ to the step size number S in response to two successive similar signal binary bits and subtracts the predetermined fraction $\Delta S$ from the step size number S in response to two successive dissimilar signal binary bits.

3. Apparatus as claimed in claim 1, wherein said storing means is a register having $n$ positions in which a binary step size number S is stored and the predetermined fixed fraction $\Delta S$ is the step size binary number S shifted down a predetermined number of positions in the register.

4. Apparatus as claimed in claim 3, in which said summing means includes means for increasing each added fraction $\Delta S$ by a fixed least significant binary number.

5. Apparatus as claimed in claim 4 wherein the integrator means consists of a capacitor integrator and wherein the first means includes:
   means for converting the stored step size number S during each period to a control pulse having a width representative of said step size number;
   means for detecting the logic level of each signal binary bit;
   first constant current source means for charging the capacitor integrator for a time determined by the width of the control pulse in response to a signal binary bit having a first logic level; and
   second constant current source means for discharging the capacitor integrator for a time determined by the width of the control pulse in response to a signal binary bit having a second logic level.

6. Apparatus as claimed in claim 5 wherein the capacitor integrator comprises:
   a first capacitor;
   a first resistor connected in parallel to said first capacitor; and
   a second resistor connected in series with a second capacitor, said serially connected second resistor and second capacitor being connected in parallel to the first capacitor.

7. An apparatus as claimed in claim 5 which further includes means for limiting the control pulse to a predetermined minimum width.

8. An apparatus as claimed in claim 7 which further includes means for maintaining the binary step size number below a predetermined upper limit.

* * * * *